United States Patent
Frey et al.

(10) Patent No.: US 9,640,704 B2
(45) Date of Patent: May 2, 2017

(54) HIGH QUANTUM EFFICIENCY PHOTODETECTOR

(71) Applicants: Commissariat à l'Énergie Atomique et aux Énergies Alternatives, Paris (FR); STMicroelectronics SA, Montrouge (FR)

(72) Inventors: Laurent Frey, Fontaine (FR); Michel Marty, Saint Paul de Varces (FR)

(73) Assignees: Commissariat à l'Énergie Atomique et aux Énergies Alternatives, Paris (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 15/163,550

(22) Filed: May 24, 2016

(65) Prior Publication Data

US 2016/0351745 A1    Dec. 1, 2016

(30) Foreign Application Priority Data

May 29, 2015  (FR) ...................... 15 54878

(51) Int. Cl.
*H01L 29/49* (2006.01)
*H01L 31/113* (2006.01)
(Continued)

(52) U.S. Cl.
CPC .... *H01L 31/1133* (2013.01); *H01L 27/14603* (2013.01); *H01L 27/14643* (2013.01); *H01L 31/02327* (2013.01); *H01L 31/107* (2013.01)

(58) Field of Classification Search
CPC .......... H01L 31/1133; H01L 27/14603; H01L 31/02327; H01L 31/107
See application file for complete search history.

(56) References Cited

U.S. PATENT DOCUMENTS 8,698,207 B2 * 4/2014 Le Perchec ..... H01L 31/022408
257/216
2010/0308427 A1 12/2010 Lenchenkov
(Continued)

FOREIGN PATENT DOCUMENTS

WO    WO 2012/032495 A1    3/2012

OTHER PUBLICATIONS

French search report, dated Apr. 4, 2016, from corresponding French Application No. 15/54878.

*Primary Examiner* — Michael Shingleton
(74) *Attorney, Agent, or Firm* — Wolf, Greenfield & Sacks, P.C.

(57) ABSTRACT

A photodetector including a photoelectric conversion structure made of a semiconductor material and, on a light-receiving surface of the conversion structure, a stack of first and second diffractive elements, the second element being above the first element, wherein: the first element includes at least one pad made of a material having an optical index n1, laterally surrounded with a region made of a material having an optical index n2 different from n1; the second element includes at least one pad made of a material having an optical index n3, laterally surrounded with a region made of a material having an optical index n4 different from n3; the pads of the first and second elements are substantially vertically aligned; and optical index differences n1–n2 and n3–n4 have opposite signs.

10 Claims, 3 Drawing Sheets

(51) Int. Cl.
*H01L 31/0232* (2014.01)
*H01L 31/107* (2006.01)
*H01L 27/146* (2006.01)

(56) References Cited

U.S. PATENT DOCUMENTS

2013/0161774 A1 6/2013 Okigawa
2015/0054042 A1 2/2015 Marty et al.

* cited by examiner

HIGH QUANTUM EFFICIENCY PHOTODETECTOR

CROSS-REFERENCE TO RELATED APPLICATION

This application claims the priority benefit of French Patent Application number 15/54878, which is hereby incorporated by reference in its entirety to the maximum extent allowable by law.

BACKGROUND

The present disclosure relates to semiconductor photodetectors, and more particularly to photodiode-type photodetectors, for example used as pixels of an image sensor, or as single-photon avalanche diodes.

DISCUSSION OF THE RELATED ART

FIG. 1 partially and schematically shows two photodetectors side by side of an assembly of photodetectors, for example forming an image sensor. Each photodetector comprises a semiconductor structure 1 for converting photons into electron-hole pairs. Structure 1 may comprise junctions (not shown) between semiconductor regions of opposite conductivity types to store the photogenerated electrons. In a complete photodetector, there further exist one or a plurality of read transistors (not shown) to transfer the electrons.

PCT patent application WO2012/032495 discloses that, when the lateral dimensions of the illuminated surface or light-receiving surface (the upper surface in FIG. 1) of a photodetector are small, in the order of wavelength λ of the light that the photodetector is intended to capture, or operating wavelength, the introduction of light into the photodetector raises an issue. Thus, the quantum efficiency of such photodetectors is low. This patent application provides, to increase the photodetector quantum efficiency, arranging on its light-receiving surface a single pad 2 having lateral dimensions smaller than the lateral dimensions of the light-receiving surface and than the operating wavelength of the photodetector.

FIG. 2 partially and schematically shows the detection portion of a photodetector of single-photon avalanche diode type, currently designated with acronym SPAD ("Single Photon Avalanche Diode"). Such a photodetector comprises a structure formed of a semiconductor layer 10, for example, of type N, pinned between two semiconductor layers 12 and 13 of opposite types. The problem is that layer 10 is, in modern technologies, very thin, typically with a thickness in the range from 1 to 1.5 μm. This layer 10 is where the useful conversion of photons into electron-hole pairs is to be performed, while it is known that, in the case of silicon and for an infrared radiation, the layer where the electron-hole pairs are to be created should have a thickness greater than 10 μm, to expect a photon conversion rate greater than 90%. Thus, the efficiency (or conversion rate) of a SPAD photodetector manufactured with current technologies does not exceed from 5 to 7%. To improve this efficiency and to avoid losing reflected light, upper semiconductor layer 12 has an antireflection structure, alternately comprising one layer of material of low index 14 made of silicon oxide, and one layer of material of higher index 15 made of silicon nitride, arranged thereon. An upper protection layer 16, made of silicon oxide, tops the antireflection structure.

Thus, a problem arises to absorb the maximum possible number of photons in photodetectors of small dimensions such as those shown in FIG. 1, and in photodetectors where the semiconductor layer for converting photons into electron-hole pairs is thin, such as that shown in FIG. 2. More generally, this problem arises more or less in all semiconductor photodetectors.

It should be noted that in photodetectors of very small dimensions or SPAD-type photodetectors, an increase, even low, of the quantum efficiency or absorption rate of the useful portion of the photodetector is in practice extremely important for the detection of light of low intensity. Thus, an efficiency gain from 1 to 5% will be considered as a significant gain by the user.

SUMMARY

Thus, an embodiment provides a photodetector comprising a photoelectric conversion structure made of a semiconductor material and, on a light-receiving surface of the conversion structure, a stack of first and second diffractive elements, the second element being above the first element, wherein the first element comprises at least one pad made of a material having an optical index n1, laterally surrounded with a region made of a material having an optical index n2 different from n1; the second element comprises at least one pad made of a material having an optical index n3, laterally surrounded with a region made of a material having an optical index n4 different from n3; the pads of the first and second elements are substantially vertically aligned; and optical index differences n1−n2 and n3−n4 have opposite signs.

According to an embodiment, the pads of the first and second elements have substantially identical lateral dimensions smaller than the operating wavelength of the photodetector.

According to an embodiment, the dimensions of the light-receiving surface of the conversion structure are in the range from 0.5 to 1.5 time the operating wavelength of the photodetector, and each of the first and second elements comprises a single pad made of the material of optical index n1, respectively n3.

According to an embodiment, the dimensions of the light-receiving surface of the conversion structure are greater than 2 times the operating wavelength of the photodetector, and each of the first and second elements comprises a periodic grating of pads made of the material of optical index n1, respectively n3.

According to an embodiment, in each of the first and second elements, said at least one pad and said region are made of materials transparent to the operating wavelength of the photodetector.

According to an embodiment, the photodetector further comprises an intermediate layer made of a material transparent to the operating wavelength of the photodetector, between the first and second elements.

According to an embodiment, the intermediate layer has a thickness in the range from 40 to 150 nm and has an optical index greater than 2.5.

According to an embodiment, in one at least of the first and second elements, the region laterally surrounding said at least one pad of the element is made of a conductive material and is connected to a terminal of application of a bias voltage.

According to an embodiment, optical index differences n1−n2 and n3−n4 are, in absolute value, greater than or equal to 1 and preferably greater than or equal to 2.

According to an embodiment, in one of the first and second elements, said at least one pad and said region are respectively made of silicon and of silicon oxide and, in the other one of the first and second elements, said at least one pad and said region are respectively made of silicon oxide and of silicon.

The foregoing and other features and advantages will be discussed in detail in the following non-limiting description of specific embodiments in connection with the accompanying drawings.

DETAILED DESCRIPTION

Figure 1:
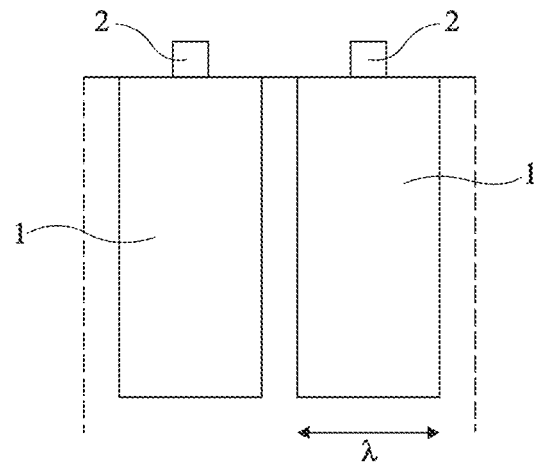
FIG. 1, previously described, is a partial simplified cross-section view of two photodetectors of small dimensions.

The same elements have been designated with the same reference numerals in the different drawings and, further, the various drawings are not to scale. In the following description, when reference is made to terms qualifying absolute positions, such as terms "front", "rear", "top", "bottom", "left", "right", etc., or relative positions, such as terms "above", "under", "upper", "lower", "lateral", etc., or to terms qualifying directions, such as terms "horizontal", "vertical", etc., it is referred to the orientation of the drawings, it being understood that, in practice, the described photodetectors may be oriented differently. Unless otherwise specified, expressions "approximately", "substantially", and "in the order of" mean to within 10%, preferably to within 5%.

Figure 3A:
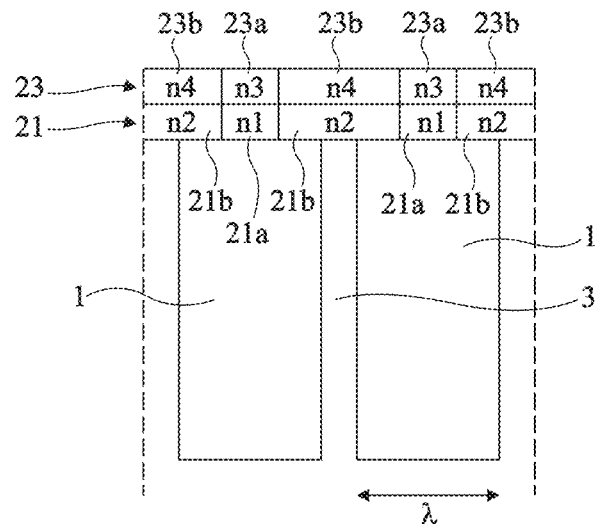
FIGS. 3A and 3B respectively are a cross-section view and a top view schematically and partially showing an embodiment of a photodetector.
Figure 3B:
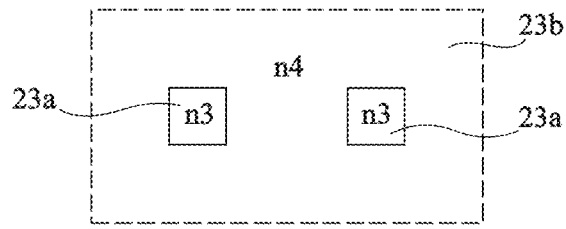

FIGS. 3A and 3B partially and schematically show an embodiment of two photodetectors side by side of an assembly of photodetectors, for example forming an image sensor. As in the example of FIG. 1, each photodetector comprises a structure 1 for converting photons into electron-hole pairs. Structure 1 is made of a semiconductor material, for example, silicon. Two neighboring semiconductor structures 1 are for example separated by an insulating region 3. Semiconductor conversions structures 1 are very schematically shown. In practice, each semiconductor structure 1 comprises one or a plurality of junctions (not shown) to store one of the carriers of each photogenerated electron-hole pair (currently electrons). Each photodetector may further comprise one or a plurality of transistors (not shown), to enable, in particular, to transfer to a read circuit (not shown) the photogenerated charges stored in semiconductor conversion structure 1.

Here, as in FIG. 1, the case where the lateral dimensions of semiconductor photoconversion structure 1 are of the same order of magnitude as wavelength λ of the light that the photodetector is intended to capture, or operating wavelength of the sensor, is considered. As an example, the lateral dimensions of the surface of exposure to light or light-receiving surface of each photoreceiver (that is, the upper surface of structure 1 in the shown example) are in the range from 0.5 to 1.5 times operating wavelength λ, which is for example in the range from 300 to 3,000 nm, and preferably in the range from 600 to 3,000 nm. It should be noted that in practice, the sensor may operate in range comprising a plurality of wavelengths. Thus, in the present description, operating wavelength means the smallest wavelength of a wavelength band that the sensor is intended to capture. As an example, the wavelength band that the sensor is intended to capture has a width in the range from 1 to 500 nm.

The light-receiving surface of semiconductor structure 1 supports a vertical stack of two diffractive elements 21 and 23. Element 21 comprises a pad 21a of a material of index n1, arranged on the light-receiving surface of structure 1 (one pad per photoreceiver, preferably centered according to the central vertical axis of the photodetector), laterally surrounded with a region 21b made of a material of optical index n2 smaller than n1. Element 23 comprises a pad 23a made of a material of index n3, arranged on the upper surface of diffractive element 21, laterally surrounded with a region 23b made of a material of optical index n4 greater than n3.

The materials forming pads 21a and 23a and peripheral regions 21b and 23b are transparent to operating wavelength λ of the photodetector. "Transparent" means that these materials absorb less than 5%, preferably less than 1%, of the radiation at this wavelength.

The lateral dimensions of pads 21a and 23a are smaller than the lateral dimensions of the light-receiving surface of semiconductor structure 1 and than the operating wavelength of the photodetector. As an example, the lateral dimensions of pads 21a and 23a are in the range from one tenth to half of the operating wavelength of the photodetector.

The lateral dimensions of pads 21a and 23a are preferably substantially identical. Further, pads 21a and 23a are preferably substantially vertically aligned, that is, in vertical projection, the contours of pads 21a and 23a are substantially confounded. As an example, in top view, the maximum distance separating the contours of pads 21a and 23a is smaller than 50 nm. Similarly, the lateral dimensions of peripheral regions 21b and 23b are preferably substantially identical, and peripheral regions 21b and 23b are preferably substantially vertically aligned (for example, with the same 50-nm tolerance).

In the shown example, pads 21a and 23a have, in top view, a substantially square shape. The described embodiments are however not limited to this specific case. More generally, pads 21a and 23a may have any shape, for example square, round, oval, or rectangular.

The thickness of each of elements 21 and 23 is preferably smaller than the operating wavelength of the photodetector, for example smaller than half this wavelength. Elements 21 and 23 may have substantially the same thickness or different thicknesses. Preferably, elements 21 and 23 have the same thickness. Indeed, the tests performed have shown that a better absorption is obtained in the case where elements 21 and 23 have the same thickness.

As an example, elements 21 and 23 cover the entire light-receiving surface of semiconductor structure 1, it being understood that, as previously indicated, pads 21a and 21b cover a portion only of this light-receiving surface, the rest being occupied by peripheral regions 21b and 23b. In the shown example, peripheral regions 21b of elements 21 of the different photodetectors of the sensor form a continuous layer substantially coating the entire surface of the sensor except for the portions covered with pads 21a. In the shown example, peripheral regions 23b of elements 23 of the different photodetectors of the sensor form a continuous layer substantially coating the entire surface of the sensor, except for the portions covered with pads 23a.

The upper structure formed by diffractive elements 21 and 23 is for example coated with an insulating protection layer (not shown), for example, made of silicon oxide, which may be topped with a filtering layer (not shown) and with a microlens specific to each photodetector (not shown).

In each of elements 21 and 23, the optical index difference between central pad 21a, respectively 23a, and peripheral region 21b, respectively 23b, is preferably relatively large, for example, greater than or equal to 1 and preferably greater than or equal to 2 in absolute value.

Optical indexes n1 and n4 of the regions of higher indexes 21a and 23b of diffractive elements 21 and 23 are for example smaller than or equal to optical index $n_{sc}$ of the semiconductor material of photoconversion structure 1.

As an example, semiconductor 1 may be silicon, of optical index $n_{sc}$ in the order of 3.6 (in the close infrared range, that is, in a wavelength range from 800 to 1,000 nm). Pad 21a may be made of the semiconductor material of structure 1 ($n1=n_{sc}$). Peripheral region 21b may be made of silicon oxide, having an optical index in the order of 1.45, and may advantageously correspond (to simplify the manufacturing process) to a structure of the type currently used to insulate components formed in a same semiconductor chip and currently called STI (for "Shallow Trench Isolation"). Region 23b may be made of polysilicon, having an optical index in the order of 3.5, and may advantageously correspond (to simplify the manufacturing process) to a layer currently used to form conductive gates in the field of MOS transistor manufacturing. Pad 23a is for example made of silicon oxide. The described embodiments are however not limited to these specific examples. As an example, pad 21a may be made of polysilicon, of amorphous silicon, of silicon carbide, or of silicon nitride. Further, as a variation, peripheral region 23b may be made of amorphous silicon, of silicon carbide, or of silicon nitride.

As a variation, the materials used to form pad 21a and peripheral region 21b of element 21 on the one hand, and the materials used to form pad 23a and peripheral region 23b on the other hand, may be exchanged. Thus, in element 21, index n1 of pad 21a may be smaller than index n2 of region 21b and, in element 23, index n3 of pad 23a may be greater than index n4 of region 23b.

It should be noted that in the case where the region of high optical index of one and/or the other of diffractive elements 21 and 23 is made of polysilicon and is formed at the same time as conductive gates of MOS transistors, a thin insulating layer, for example, a silicon oxide layer having a thickness smaller than 10 nm (corresponding to the gate insulator of the transistors) may form an interface between this element and the underlying structure, for example, between element 23 and element 21, or between element 21 and structure 1. Further, a spacer of small thickness made of an insulating material, for example, a silicon nitride spacer having a thickness in the range from 30 to 70 nm, may laterally separate the polysilicon, forming the region of higher index of diffractive element 21 or 23, from the silicon oxide forming the region of lower index of the diffractive element.

It should be noted that if regions 23b of upper diffractive elements 23 form a continuous conductive layer extending over substantially the entire surface of the sensor except for the portions occupied by pads 23a, it may be provided to connect layer 23b to a terminal of application a bias voltage, for example, in the vicinity of a sensor edge. Thus, layer 23b may, in operation, be biased to decrease dark currents capable of altering the performances of photodetectors. As an example, layer 23b may be biased to a positive voltage to avoid for parasitic electrons generated in the vicinity of the upper surface of semiconductor region 1 to be collected by the photogenerated charge collection region of the photodetector.

As a variation, if regions 21b of lower diffractive elements 21 form a continuous conductive layer, and if this layer is separated from semiconductor region 1 by an insulating layer (for example, if layer 21b is made of polysilicon and is separated from the substrate by a thin silicon oxide layer), it may be provided, for the same purpose, to connect layer 21b to a terminal of application of a bias voltage.

As will be discussed hereafter, it can surprisingly be observed that a structure of the type described in relation with FIGS. 3A and 3B, properly sized, significantly increases the efficiency of the conversion of photons into electron-hole pairs with respect to a structure of the type shown in FIG. 1. It could have been expected for the placing, on the light path, of two successive diffractive elements having substantially complementary arrangements to generate no increase of the quantum efficiency with respect to a photodetector which does not comprise these elements, or at least to generate an increase of the quantum efficiency smaller than that provided by a single diffractive element (such as shown in FIG. 1). Indeed, it could have been expected for diffraction phenomena, beneficial in terms of efficiency, caused by the first diffractive element to be at least partly counterbalanced by the second diffractive element. The opposite however occurs, that is, the stack of the two diffractive elements having complementary arrangements enables to increase by several percents the quantum efficiency over a photodetector with a single diffractive element.

Figure 4:
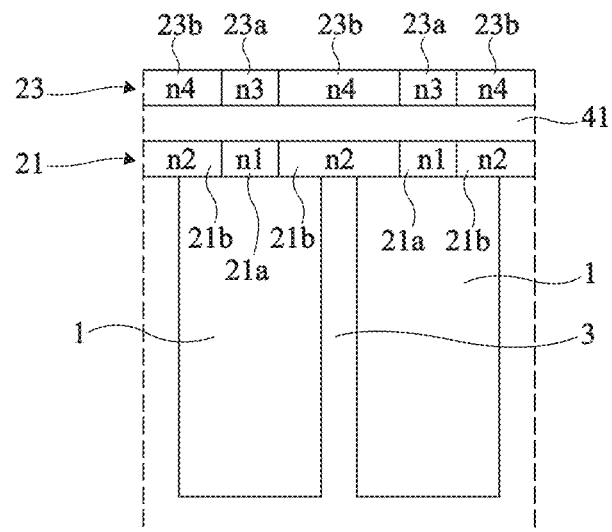
FIG. 4 is a cross-section view schematically and partially showing an alternative embodiment of the photodetector of FIGS. 3A and 3B.

FIG. 4 is a cross-section view schematically and partially showing an alternative embodiment of the photo-detectors of FIGS. 3A and 3B.

The structure of FIG. 4 comprises the same elements as the structure of FIGS. 3A and 3B. These elements will not be detailed again.

The structure of FIG. 4 differs from the structure of FIGS. 3A and 3B essentially in that it comprises an additional layer 41 made of a material transparent to the operating wavelength of the photodetector, separating diffractive element 21 from diffractive element 23.

It can be observed, as will be discussed hereafter, that the presence of interface layer 41 between the diffractive elements 21 and 23 enables to further increase the quantum efficiency of the photodetector over the structure of FIGS. 3A and 3B. More particularly, in the case of a semiconductor silicon substrate and of diffractive elements based on silicon oxide (forming the region of lower index of the diffractive element) and on silicon (forming the region of higher index of the diffractive element), an efficiency increase can be obtained when layer 41 has a thickness in the range from 40 to 150 nm and an optical index greater than 2.5. The increase is particularly significant when layer 41 has a thickness in the range from 50 to 80 nm and an optical index in the order of 3.6.

As an example, layer 41 may be a polysilicon or amorphous silicon layer deposited on the upper surface of diffractive element 21.

As a variation, the materials of diffractive element 21 respectively are single-crystal silicon and silicon oxide, diffractive element 21 being buried under a single-crystal silicon layer forming layer 41. To form such a structure, it may be started from a first single-crystal substrate having photoconversion structure 1 formed inside of it. Diffractive element 21 is formed on the front surface side of a second single-crystal silicon substrate. After the forming of diffractive element 21, the second substrate is placed on the first substrate, so that the light-receiving surface of structure 1 faces diffractive element 21 (that is, faces the front surface of the second substrate). The second substrate may then be thinned from its rear surface so as to only keep, above diffractive element 21, a thin single-crystal silicon thickness corresponding to layer 41. The diffractive element may then be formed on the upper surface of layer 41.

Figure 5A:
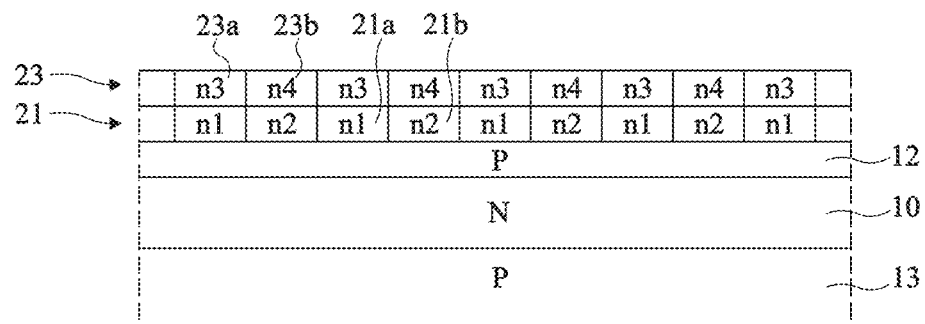
FIGS. 5A and 5B respectively are a cross-section view and a top view schematically and partially showing another embodiment of a photodetector.
Figure 5B:
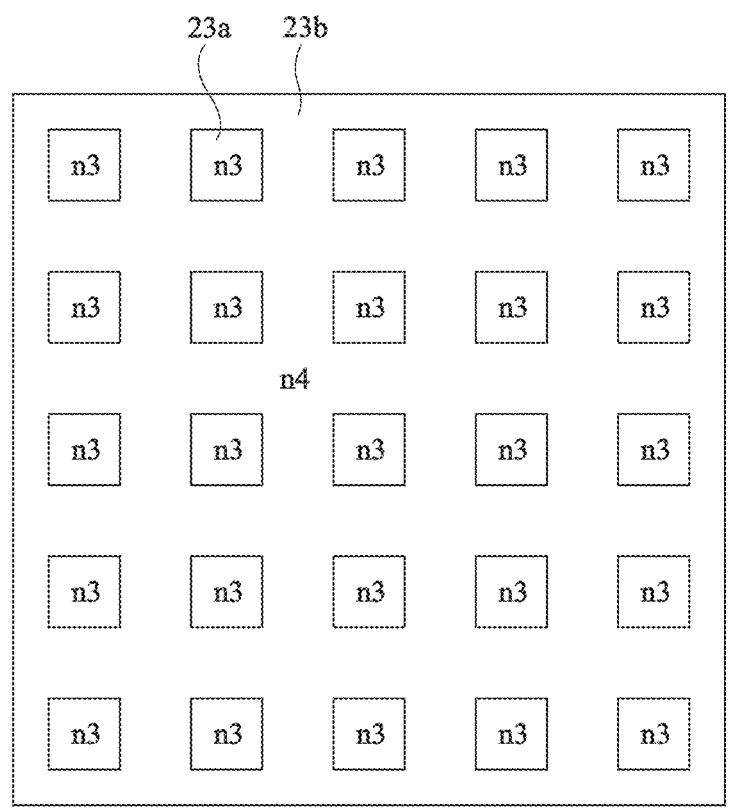

FIGS. 5A and 5B respectively are a cross-section view and a top view schematically and partially showing another embodiment of a photodetector.

This time, the case where the lateral dimensions of the semiconductor photoconversion structure of the photodetector are in the order of a plurality of times the operating wavelength of the photodetector, for example greater than twice the operating wavelength, which is for example in the range from 300 to 3,000 nm, and preferably in the range from 600 to 3,000 nm, is considered.

Figure 2:
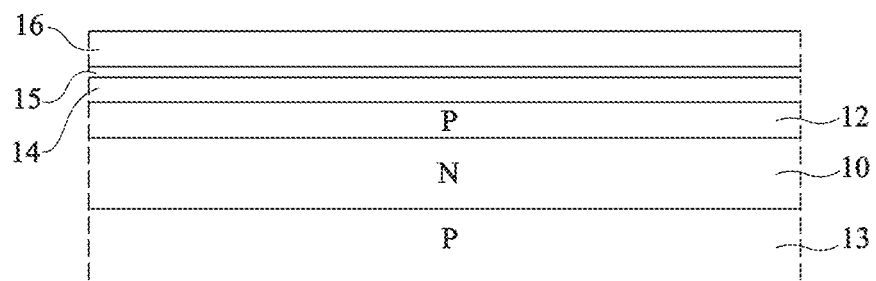
FIG. 2, previously described, is a partial simplified cross-section view of a SPAD-type photodetector.

As an example, the photodetector of FIGS. 5A and 5B is a SPAD-type photodetector having its semiconductor photoconversion structure comprising, as in the example of FIG. 2, a layer 10 of transformation of photons into electron-hole pairs of a first conductivity type, for example, of type N, surrounded with two layers 12 and 13 of the opposite conductivity type.

In the example of FIGS. 5A and 5B, diffractive element 21 comprises no longer a single pad 21a (per photodetector) of index n1 laterally surrounded with a region 21b of index n2 different from n1, but a periodic grating of pads 21a (per photodetector) of index n1 laterally separated by region 21b of index n2 which forms a continuous layer substantially topping the entire light-receiving surface except for the portions topped with pads 21a.

Further, in the example of FIGS. 5A and 5B, diffractive element 23 no longer comprises a single pad 23a of index n3 laterally surrounded with a region 23b of index n4 different from n3, but rather a periodic grating of pads 23a of index n3 laterally separated by region 23b of index n4, which forms a continuous layer substantially topping the entire light-receiving surface except for the portions topped with pads 23a.

Pads 21a, 23a and regions 21b, 23b of pad separation are of the same type as what has been described in relation with FIGS. 3A and 3B. Further, as in the example of FIGS. 3A and 3B, pads 21a and 23a on the one hand and regions 21b and 23b on the other hand of diffractive elements 21 and 23 are substantially vertically aligned.

As an example, in each of diffractive elements 21 and 23, the pitch of the pads may be equal to two thirds, to within 30%, of the operating wavelength of the photodetector, the lateral dimensions of the pads may be in the range from one tenth to half of the wavelength, and the distance between the pads may be in the range from one sixth to two thirds of the wavelength.

The alternative embodiment of FIG. 4 may be transposed to the embodiment of FIGS. 5A and 5B, that is, diffractive elements 21 and 23 of FIG. 5A may be separated by an intermediate layer 41 of the type described in relation with FIG. 4.

Comparative measurements have been made for a SPAD-type photodetector, in three different configurations A, B, and C. In configuration A, the SPAD photodiode is coated with a single grating of periodic pads, for example, grating 21 of FIG. 5A. In configuration B, the SPAD photodiode is coated with a stack of two gratings of stacked periodic pads 21 and 23, such as shown in FIG. 5A. In configuration C, the SPAD photodiode is coated with a stack of two periodic gratings of pads 21 and 23 separated by a spacing layer 41 of the type described in relation with FIG. 4.

The case where pads 21a of grating 21 are made of silicon oxide and are laterally separated by a continuous single-crystal silicon region 21b (that is, grating 21 is formed in the upper portion of the semiconductor substrate) is considered herein. Pads 23a of grating 23 are made of single-crystal silicon and are laterally separated by a continuous silicon oxide region 23b.

In configurations A and B, layers 10 and 12 of the SPAD photodiode are silicon layers having an approximate thickness of 1.5 and 0.7 μm, respectively. The thickness of grating 21, that is, the height of pads 21a, is approximately 300 nm. The thickness of grating 23, that is, the height of pads 23a, is approximately 180 nm.

In configuration C, layers 10 and 12 of the SPAD photodiode are silicon layers having an approximate thickness of 1.5 and 0.8 μm, respectively. Gratings 21 and 23 have substantially the same thickness, in the order of 240 nm.

A parametric study has been carried out by varying, in each configuration, the width of the pads of the grating(s), and the distance between pads.

In configuration A, it can be observed that a maximum absorption rate of 10.2% can be obtained, with a pad width of approximately 380 nm and a distance between pads of approximately 160 nm.

In configuration B, it can be observed that the maximum absorption rate rises up to 12.6%, for a pad width of approximately 250 nm and a distance between pads of approximately 280 nm.

In configuration C, a maximum absorption rate of 14.4% can be obtained, in the case where intermediate layer 41 is a silicon layer having a thickness in the range from 50 to 80 nm, for a pad width of approximately 220 nm and a distance between pads of approximately 300 nm.

It should be noted that in each of the above-mentioned configurations, the obtained absorption rates also vary according to the thicknesses of gratings 21 and/or 23. It can however be observed that whatever the considered thicknesses, the maximum quantum efficiency which may be achieved is always better with two stacked gratings (configuration B) than with a single grating (configuration A), and is even better when the two gratings are separated by intermediate layer 41 (configuration C).

Similar results can further be observed when the grating types are inverted, that is, when the pads of grating 21 are made of a material of high index and are separated two by two by a material of low index, and when the pads of grating 23 are made of a material of low index and are separated two by two by a material of high index.

Generally, it will be within the abilities of those skilled in the art to optimize the pad dimensions with conventional simulation methods, by using simulation programs such as software DiffractMOD (www.rsoftdesign.com) or software Grating Toolbox (www.lighttrans com). Thus, with such a previous simulation calculation, it will be within the abilities of those skilled in the art, with no trial and error, to size diffractive elements 21 and 23 and, possibly, intermediate layer 41 in order to increase the quantum efficiency or photon absorption rate of a photodiode.

Specific embodiments have been described. Various alterations, modifications, and improvements will readily occur to those skilled in the art. In particular, the materials forming diffractive elements 21 and 23 may be different from the above-mentioned examples, provided for them to be transparent to the operating wavelength and to respect the previously-described relations between indexes n1, n2, n3, and n4, that is, provided for differences n1−n2 and n3−n4 to be non-zero and to be of opposite signs.

In the described embodiments, to obtain a significant improvement of the quantum efficiency, pads 21a, 23a are preferably sized by taking into account not only the smallest wavelength λ that the sensor is intended to capture but also the largest wavelength Λ that the sensor is intended to capture. In particular, the period (or pitch) of pads 21a, respectively 23a, is preferably smaller than $\lambda/n_{inc}$, $n_{inc}$ being the optical index of the incident medium (the medium located upstream of diffractive elements 21 and 23), to avoid diffraction in the incident medium, and greater than $\Lambda/n_{sc}$, $n_{sc}$ being the optical index of the semiconductor material of structure 1, to have diffraction in semiconductor medium 1.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photodetector comprising a photoelectric conversion structure made of a semiconductor material and, on a light-receiving surface of the conversion structure, a stack of first and second diffractive elements, the second element being above the first element, wherein:
   the first element comprises at least one pad made of a material having an optical index n1, laterally surrounded with a region made of a material having an optical index n2 different from n1;
   the second element comprises at least one pad made of a material having an optical index n3, laterally surrounded with a region made of a material having an optical index n4 different from n3;
   the pads of the first and second elements are substantially vertically aligned; and
   optical index differences n1−n2 and n3−n4 have opposite signs.

2. The photodetector of claim 1, wherein the pads of the first and second elements have substantially identical lateral dimensions smaller than the operating wavelength of the photodetector.

3. The photodetector of claim 1, wherein the dimensions of the light-receiving surface of the conversion structure are in the range from 0.5 to 1.5 time the operating wavelength of the photodetector, and wherein each of the first and second elements comprises a single pad made of the material of optical index n1, respectively n3.

4. The photodetector of claim 1, wherein the dimensions of the light-receiving surface of the conversion structure are greater than 2 times the operating wavelength of the photodetector, and wherein each of the first and second elements comprises a periodic grating of pads made of the material of optical index n1, respectively n3.

5. The photodetector of claim 1, wherein, in each of the first and second elements, said at least one pad and said region are made of materials transparent to the operating wavelength of the photodetector.

6. The photodetector of claim 1, further comprising an intermediate layer made of a material transparent to the operating wavelength of the photodetector, between the first and second elements.

7. The photodetector of claim 6, wherein said intermediate layer has a thickness in the range from 40 to 150 nm and has an optical index greater than 2.5.

8. The photodetector of claim 1, wherein, in at least one of the first and second elements, the region laterally surrounding said at least one pad of the element is made of a conductive material and is connected to a terminal of application of a bias voltage.

9. The photodetector of claim 1, wherein optical index differences n1−n2 and n3−n4 are, in absolute value, greater than or equal to 1, and preferably greater than or equal to 2.

10. The photodetector of claim 1, wherein, in one of the first and second elements, said at least one pad and said region are respectively made of silicon and of silicon oxide and, in the other one of the first and second elements, said at least one pad and said region are respectively made of silicon oxide and of silicon.

* * * * *